(12) United States Patent
Templeton et al.

(10) Patent No.: US 6,495,435 B2
(45) Date of Patent: Dec. 17, 2002

(54) METHOD FOR IMPROVED CONTROL OF LINES ADJACENT TO A SELECT GATE USING A MASK ASSIST FEATURE

(75) Inventors: Michael K. Templeton, Atherton, CA (US); Hao Fang, Cupertino, CA (US); Maria C. Chan, San Jose, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/788,246

(22) Filed: Feb. 15, 2001

(65) Prior Publication Data

US 2001/0034113 A1 Oct. 25, 2001

Related U.S. Application Data

(60) Provisional application No. 60/183,501, filed on Feb. 17, 2000.

(51) Int. Cl.$^7$ ............................................... H01L 21/20
(52) U.S. Cl. ........................................ 438/584; 430/325
(58) Field of Search .................................. 438/584, 128, 438/275, 259, 692, 743, 758; 430/325, 313

(56) References Cited

U.S. PATENT DOCUMENTS 6,372,412 B1 * 4/2002 Hakey et al. ................ 430/328

* cited by examiner

*Primary Examiner*—David Nelms
*Assistant Examiner*—Dung Anh Le
(74) *Attorney, Agent, or Firm*—Sawyer Law Group LLP

(57) ABSTRACT

A method and system for providing a plurality of lines in a semiconductor memory device is disclosed. The method and system include providing a semiconductor substrate, providing a plurality of lines and providing an adjacent feature. The plurality of lines includes an adjacent line adjacent to the adjacent feature. The each of the plurality of lines has a line width that is substantially the same for each of the plurality of lines. The plurality of lines is preferably formed utilizing a mask to print a physical mask for the plurality of lines and the adjacent feature. The mask includes a mask assist feature between at least a first polygon for the adjacent line and at least a second polygon for the adjacent feature. The mask assist feature has a size that is sufficiently large to affect the width of the adjacent line and that is sufficiently small to prevent a corresponding feature from being printed on the physical mask. The method and system also preferably include removing a second portion of the layer of material exposed by the pattern of the physical mask to form the plurality of lines.

7 Claims, 4 Drawing Sheets

METHOD FOR IMPROVED CONTROL OF LINES ADJACENT TO A SELECT GATE USING A MASK ASSIST FEATURE

This application claims the benefit of Ser. No. 60/183,501, filed Feb. 17, 2000.

FIELD OF THE INVENTION

The present invention relates to semiconductor devices, particularly memory devices, and more particularly to a method and system for providing lines of similar size and, therefore, similar characteristics.

BACKGROUND OF THE INVENTION

Currently, semiconductor memory devices are used for many applications. Semiconductor memory devices typically include memory cells in their core region. Flash memory cells typically include floating gates made of first polysilicon lines formed from a first layer of polysilicon, control gates made of polysilicon word lines formed from a second layer of polysilicon and an insulating layer that separates the control gates from the floating gates. The floating gates are typically separated from the semiconductor substrate by a gate dielectric layer. In addition, select gates are typically provided. The select gates are typically at each end of the word lines. For example, sixteen word lines are typically provided. Before the first word line and after the sixteenth word line, a select gate is provided.

FIG. 1 depicts a conventional method 10 for providing polysilicon lines, such as the word lines, in a memory device, such as a NAND memory device. A conventional mask for use in printing a conventional pattern on a layer of photoresist is provided, via step 12. The conventional mask has a single polygon, or line, for each word line and each select gate to be provided in the polysilicon layer. The select gates, which are adjacent to the word lines, are spaced farther from the first and last word lines than the word lines are spaced from each other.

A second layer of polysilicon for the word lines is provided on the conventional memory device, via step 14. A layer of photoresist is then spun on the second polysilicon layer, via step 16. A conventional pattern is then printed on the photoresist using the conventional mask, via step 18. Thus, a conventional physical mask is formed in step 18. The conventional physical mask covers portions of the second polysilicon layer which will become the word lines and the select gates. The underlying polysilicon layer is then etched, via step 20. Thus, the word lines are formed in step 20. The conventional physical mask is then stripped and conventional processing continues, via step 22.

FIG. 2A depicts a conventional mask 30 provided in step 12 of the conventional method 10. The conventional mask 30 includes polygons 32 and 36 for the select gates. The conventional mask 30 also includes polygons 34-1, 34-2, 34-3, 34-4, and 34-5 for the word lines in the conventional memory device. Although only polygons 34-1 through 34-5 for five lines are depicted, typically a larger number of lines, such as sixteen, are formed. Thus, polygons for sixteen lines are typically provided. The polygons 34-1, 34-2, 34-3, 34-4 and 34-5 are separated by the same spacing, s2, and have the same width, w2. The polygons 32 and 36 have the same width, w1, and are separated from adjacent polygons 34-1 and 34-5, respectively, by the spacing s1. Typically, the spacing si is greater than the spacing s2.

FIG. 2B depicts a portion of the conventional memory device 40 including the conventional physical mask 50 provided in step 18 of the conventional method 10. The conventional memory device 40 includes a substrate 41 and a polysilicon layer 42 that is to be etched to form the word lines and select gates. The conventional physical mask 50 includes conventional lines 52 and 56 corresponding to the select gates. The conventional physical mask 50 also includes conventional lines 54-1, 54-2, 54-3, 54-4 and 54-5 corresponding to the word lines.

FIG. 2C depicts the conventional semiconductor memory device 40' after the polysilicon lines have been etched in step 22 and the conventional physical mask has been stripped in step 22 of the method 10 depicted in FIG. 1. Referring to FIG. 2C, the conventional memory device 40' still includes the substrate 41'. However, the polysilicon layer 42 has been etched to form select gates 62 and 66 and word lines 64-1, 64-2, 64-3, 64-4 and 64-5. The select gates 62 and 66 are separated from the adjacent word lines 64-1 and 64-5 by a spacing, s1, of approximately 0.35 micron. The word lines 64-1 through 64-5 are separated by a spacing, s2, of approximately 0.25 micron.

Although the conventional method 10 can be used to form select gates 62 and 66 as well as word lines 64-1, 64-2, 64-3, 64-4 and 64-5, one of ordinary skill in the art will readily recognize that optical effects adversely affect the performance of the conventional memory device 40'. Referring to FIGS. 2B and 2C, the conventional lines 52 and 56 have a width, w1, corresponding to the width set by the conventional mask 30 and that is desired for the select gates. The conventional lines 54-2, 54-3 and 54-4 have a width w2 corresponding to the width in the conventional mask 30. Similarly, the conventional lines 54-2, 54-3 and 54-4 are spaced by a distance s2 corresponding to the spacing set by the conventional mask 30. The width of the conventional lines 54-1 and 54-5, however, is affected by the greater distance between the polygons 32 and 34-1 and the polygons 36 and 34-5, respectively. In particular, it is known that optical effects cause structures which are in closer proximity to be printed with a smaller width than structures that are separated by a larger distance. Thus the lines 54-1 and 54-5 are printed with a larger width, w3, than the lines 54-2, 54-3 and 54-4 because a greater distance separates the lines 54-1 and 54-5 from the lines 52 and 56, respectively.

Because the widths of the lines 54-1 and 54-5 are different from the widths of the lines 54-2, 54-3 and 54-4, the widths of word lines 64-1 and 64-5 are different from the widths of word lines 54-2, 54-3 and 54-4. This is depicted in FIG. 2C, which indicates that the word lines 64-1 and 64-5 have a width of w3 while the word lines 64-2, 64-3 and 64-4 have a width of w2. Because the word lines 64-1 and 64-5 have a different width from the remaining word lines 64-2, 64-3 and 64-4, the word lines 64-1 and 64-5 have a different electrical characteristics. Thus, the performance of word lines 64-1 and 64-5 differs from that of word lines 64-2, 64-3 and 64-4. Different performances for different word lines cause differences in the behavior of memory cells in the conventional memory device 40'. Differences in behavior of the memory cells of the conventional memory device 40' is undesirable.

Accordingly, what is needed is a system and method for providing lines having similar characteristics. The present invention addresses such a need.

SUMMARY OF THE INVENTION

The present invention provides a method and system for providing a plurality of lines in a semiconductor memory device. The method and system comprise providing a semiconductor substrate, providing a plurality of lines and providing an adjacent feature. The plurality of lines includes an adjacent line adjacent to the adjacent feature. The each of the plurality of lines has a line width that is substantially the same for each of the plurality of lines. The plurality of lines is preferably formed utilizing a mask to print a physical mask for the plurality of lines and the adjacent feature. The mask includes a mask assist feature between at least a first polygon for the adjacent line and at least a second polygon for the adjacent feature. The mask assist feature has a size that is sufficiently large to affect the width of the adjacent line and that is sufficiently small to prevent a corresponding feature from being printed on the physical mask. The method and system also preferably include removing a second portion of the layer of material exposed by the pattern of the physical mask to form the plurality of lines.

According to the system and method disclosed herein, the present invention provides lines which have substantially the same width and, therefore, substantially the same performance.

DETAILED DESCRIPTION OF THE INVENTION

Figure 1:
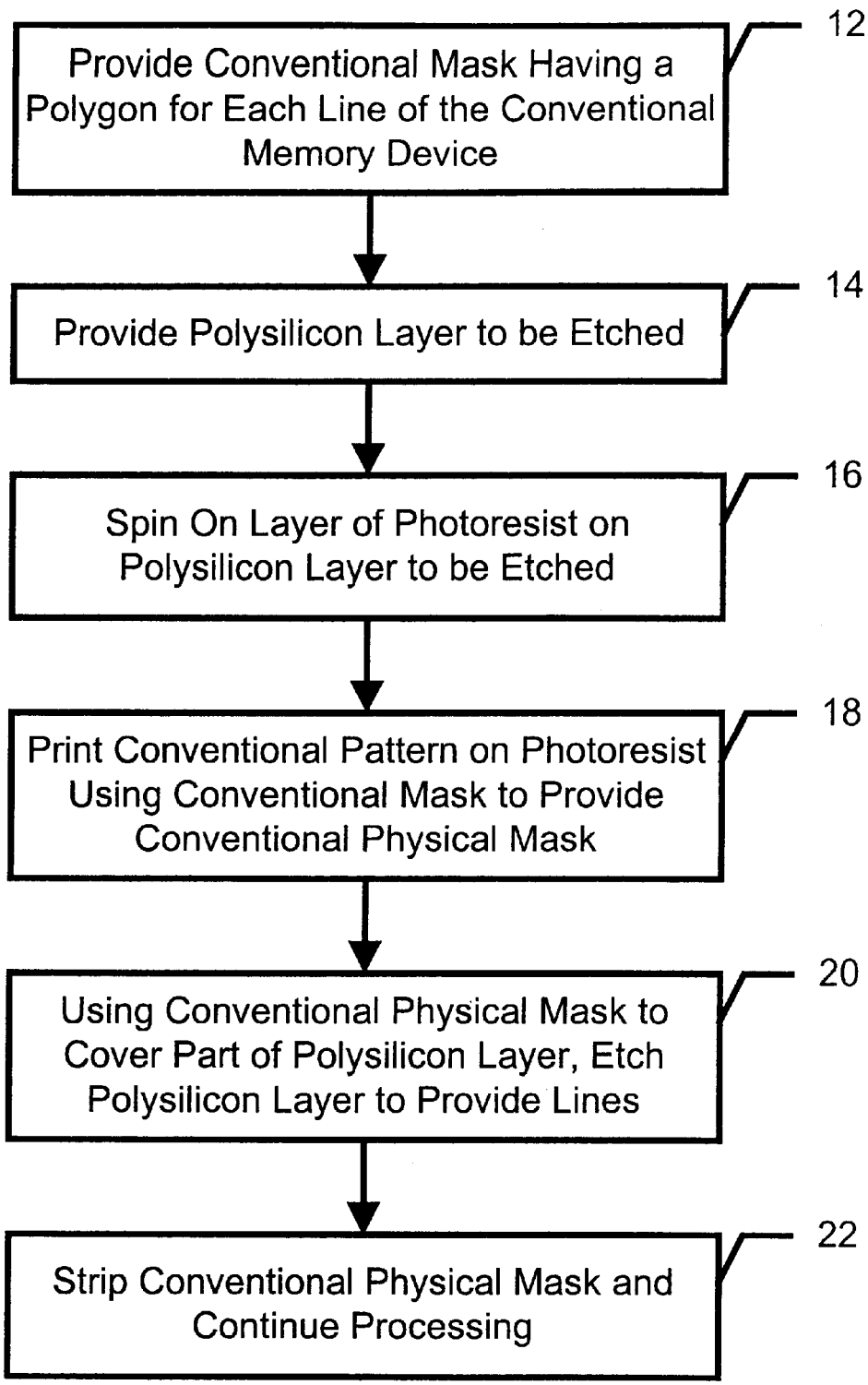
FIG. 1 is a flow chart depicting a conventional method for providing word lines in a conventional memory device.
Figure 2A:
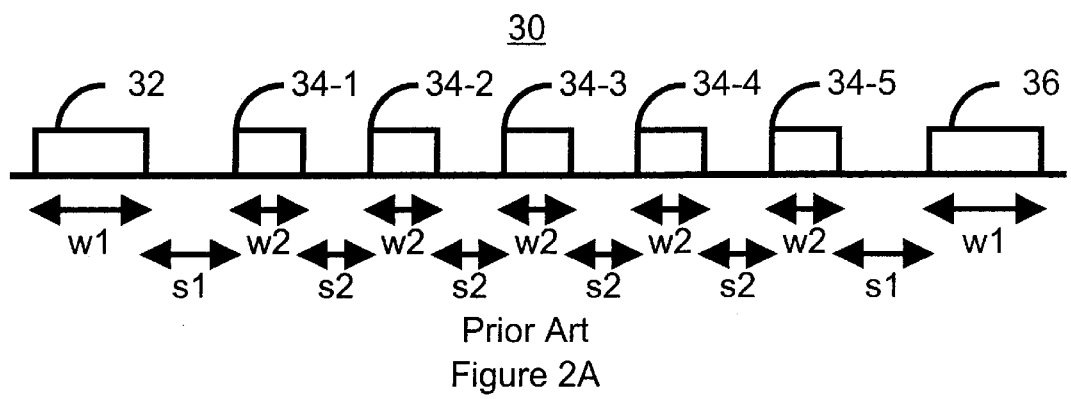
FIG. 2A is a diagram of a conventional mask.
Figure 2B:
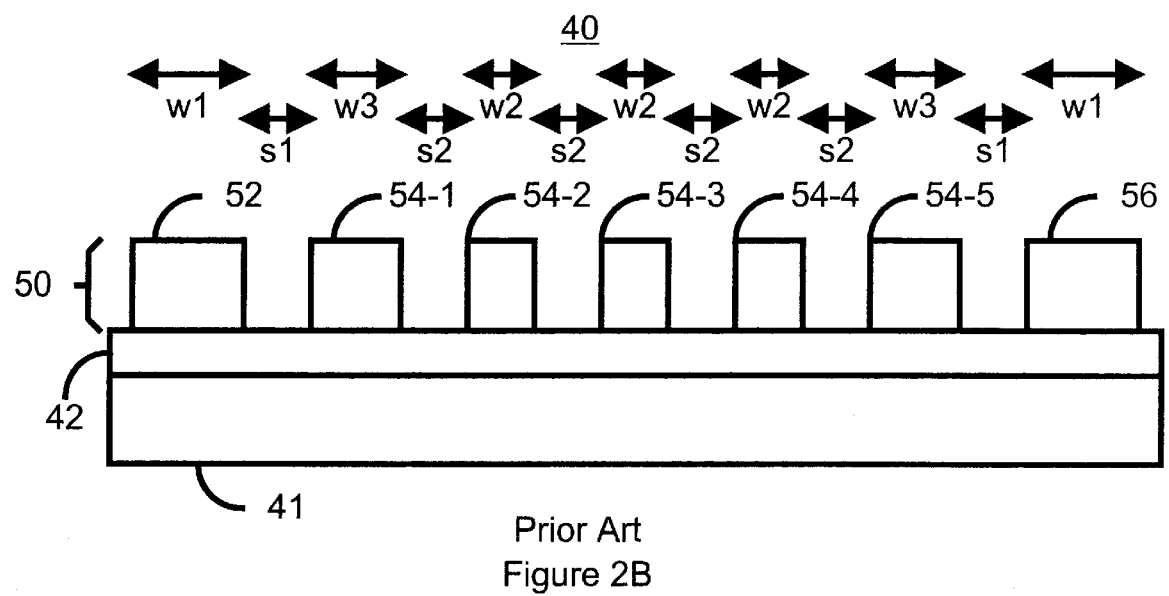
FIG. 2B is a diagram of a conventional memory device during processing, including a conventional physical mask.
Figure 2C:
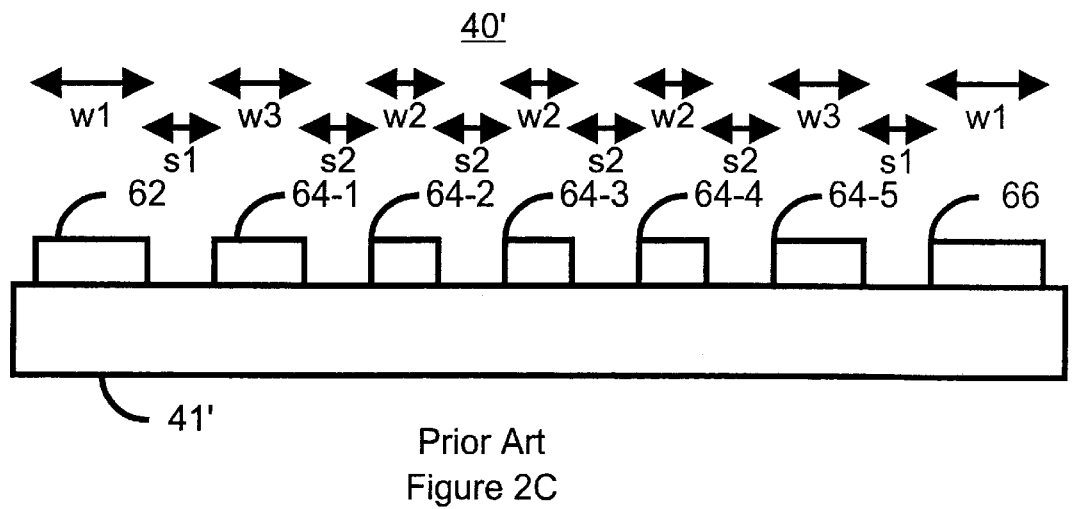
FIG. 2C is a diagram of a conventional memory device after the conventional physical mask has been stripped.

The present invention relates to an improvement in semiconductor memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Word lines in conventional memory devices are formed using a conventional mask which typically includes a polygon for each word line to be formed. Select gates typically located adjacent to a set of word lines are generally formed using the same mask. Thus, the conventional mask also includes a polygon for each select gate. The spacing between the select gate and an adjacent word line is typically greater than the spacing between two word lines. A conventional physical mask is then printed from the conventional mask. Optical effects can cause conventional lines corresponding to the word lines adjacent to select gates to be printed at a different width than other conventional lines corresponding to central word lines. When the underlying polysilicon layer is etched, the word lines adjacent to the select gates will be wider than other word lines. Consequently, these adjacent word lines will have different electrical characteristics than other word lines. The performance of the adjacent word lines will, therefore, differ from the performance of other word lines, which is undesirable.

The present invention provides a method and system for providing a plurality of lines in a semiconductor memory device. The method and system comprise providing a semiconductor substrate, providing a plurality of lines and providing an adjacent feature. The plurality of lines includes an adjacent line adjacent to the adjacent feature. The each of the plurality of lines has a line width that is substantially the same for each of the plurality of lines. The plurality of lines is preferably formed utilizing a mask to print a physical mask for the plurality of lines and the adjacent feature. The mask includes a mask assist feature between at least a first polygon for the adjacent line and at least a second polygon for the adjacent feature. The mask assist feature has a size that is sufficiently large to affect the width of the adjacent line and that is sufficiently small to prevent a corresponding feature from being printed on the physical mask. The method and system also preferably include removing a second portion of the layer of material exposed by the pattern of the physical mask to form the plurality of lines.

The present invention will be described in terms of particular processes and materials, such as photoresist and polysilicon lines. However, one of ordinary skill in the art will readily recognize that this method and system will operate effectively for other materials and other processes. The present invention is also described in terms of particular steps. However, one of ordinary skill in the art will readily realize that certain steps have been omitted for the purposes of clarity. The present invention will also be described in the context of providing word lines in a preferred embodiment. However, one of ordinary skill in the art will readily realize that the method and system is consistent with providing other lines in the core of memory semiconductor devices. Furthermore, the present invention will be described in the context of a specific feature, select gates, adjacent to one or more word lines and a specific number of word lines. One of ordinary skill in the art, however, will readily realize that the present invention functions for other features adjacent to the word lines and another number of word lines.

Figure 3:
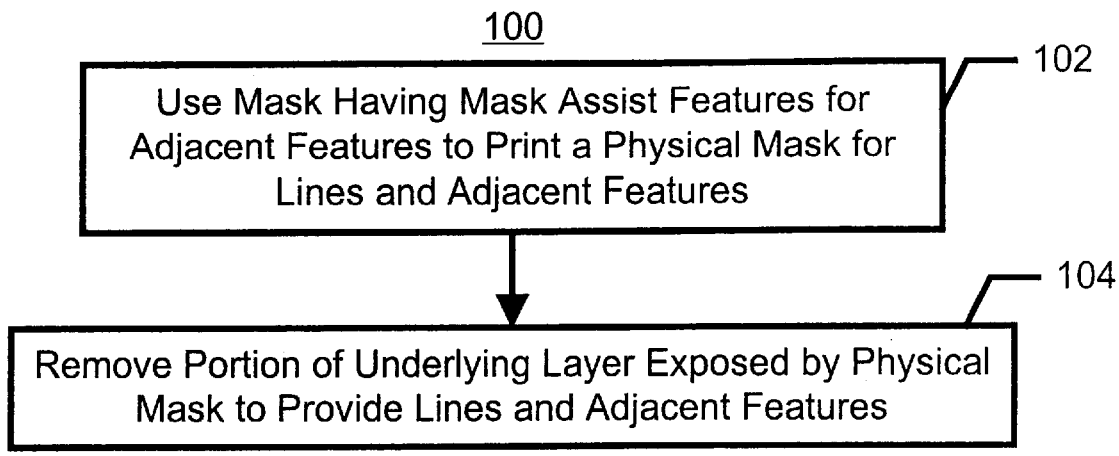
FIG. 3 is a high-level flow chart of one embodiment of a method in accordance with the present invention for providing lines in a memory device.

To more particularly illustrate the method and system in accordance with the present invention, refer now to FIG. 3, depicting a high-level flow chart of one embodiment of a method in accordance with the present invention for providing lines, such as word lines, a memory device. A mask in accordance with the present invention is used for printing a pattern in a physical mask, via step 102. The mask utilized in step 102 has a plurality of polygons for a plurality of lines and a plurality of adjacent features to be provided. For example, the mask may have polygons for the word lines and for the select gates, which are adjacent to the word lines. The spacing between each of the plurality lines is desired to be different than the spacing between an adjacent feature and a line ("adjacent line") that is next to the adjacent feature. For example, the spacing between an end word line ("adjacent word line") and the adjacent feature may be desired to be a first spacing, s1, while the spacing between each of the word lines may be desired to be a first spacing, s2. As a result, the spacing between the polygons corresponding to the plurality of lines may be different than the spacing between these polygons and the polygons corresponding to the adjacent features. The mask also includes mask assist features between the adjacent lines and the adjacent features. The mask assist features are scattering bars. Preferably, one mask assist feature is provided for each adjacent feature. However, nothing prevents another number of mask assist features being provided for each adjacent feature. Each of the mask assist features is small enough not to be printed when a physical mask is printed from the mask. However, the mask assist features are also large enough to affect the size of lines in the physical mask which correspond to the adjacent lines. In particular, the mask assist features reduce the width of the lines in the physical mask which correspond to the adjacent lines. In a preferred embodiment, where one mask assist feature is used for each adjacent line and is placed centrally between the adjacent feature and the adjacent line. Also in a preferred embodiment, the size of the mask assist features is between one-fifth and one-half of the wavelength of light used to print the physical mask. Thus, for light having a wavelength of two hundred and forty-eight nanometers, the mask assist feature is approximately fifty to one hundred and twenty nanometers.

A portion of an underlying layer, from which the plurality of lines and the adjacent features are formed, is then removed, via step 104. The portion of the underlying layer that is removed is exposed by the pattern printed in the physical mask. Thus, a remaining portion of the underlying layer corresponds to the plurality of lines and the adjacent features.

Because the mask has mask assist features, the portion of the pattern of the physical mask that corresponds to the adjacent lines is printed thinner. Thus, the optical effects which would otherwise result in different performance of the adjacent lines are accounted for. As a result, the adjacent lines formed using the method 100 can have substantially the same size as the remaining lines. Consequently, the memory device in accordance with the present invention has electrical characteristics that are more uniform and, therefore, closer to what is desired.

Figure 4:
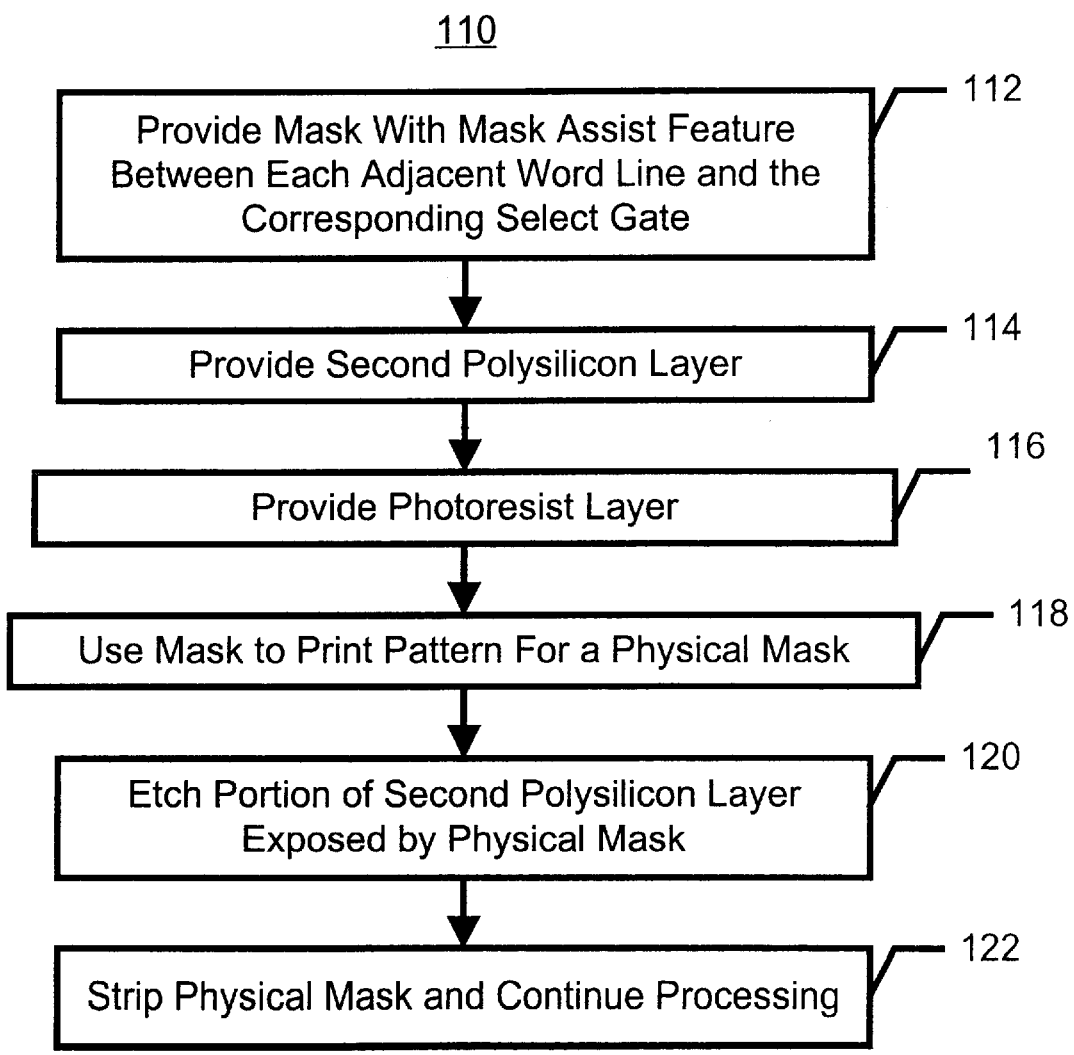
FIG. 4 is a flow chart of a preferred embodiment of a method in accordance with the present invention for providing lines a memory device.

FIG. 4 depicts a more detailed flow chart of a preferred embodiment of a method 110 for providing word lines and select gates in a memory device. Thus, for the method 110, the select gates are the adjacent features. Preferably, there are two select gates for a set of sixteen word lines, one select gate on either side of a set of word lines. Thus, the first and last word lines are the adjacent word lines. The method 110 in FIG. 4 is preferably used for providing the word lines and select gates used in forming floating gates for memory cells in NAND devices.

A mask having polygons for the plurality of word lines and the select gates and mask assist structures is provided, via step 112. The mask preferably has a single mask assist structure for each adjacent word line. Each mask assist structure is located between the polygon(s) corresponding to an adjacent word line and the polygon(s) corresponding to the select gate next to the adjacent word ling. Each mask assist structure is preferably located halfway between the polygons for the corresponding adjacent word line and the polygons for the corresponding select gate. The second polysilicon layer is provided, via step 114. The second polysilicon layer is to be used to form the word lines. A photoresist layer is then provided on the second polysilicon layer, via step 116. In a preferred embodiment, the photoresist layer is spun onto the second polysilicon layer. A pattern for a physical mask for the select gates and word lines is then printed on the photoresist layer using the mask provided in step 112, via step 118. Thus, a physical mask is provided in step 118. Because of the mask assist features in the mask, the portions of the physical mask corresponding to the adjacent word lines can be printed with substantially the same width as other word lines. Consequently, electrical performance for the memory device formed using the method 110 is improved. Furthermore, the mask assist features are not present in the physical mask because of the small size of the mask assist features. Thus, the desired spacing between the adjacent word lines and the select gates is maintained without introducing any extraneous structures.

The second polysilicon layer is then etched, via step 120. A portion of the second polysilicon layer exposed by the physical mask is thus removed in step 120. Consequently, the plurality of word lines and the select gates are formed. The physical mask is then stripped and processing proceeds, via step 122.

Figure 5A:
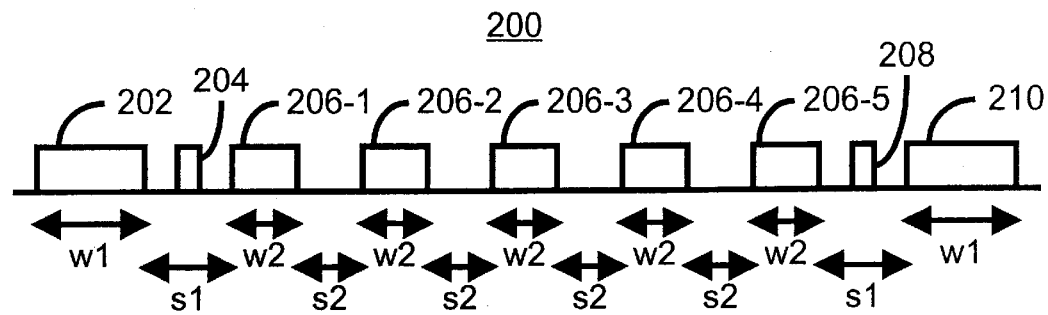
FIG. 5A is a diagram of a mask formed in accordance with the present invention.

FIG. 5A depicts a mask 200 formed using the method 100 or 110. The mask 200 includes polygons 202 and 210, which correspond to the desired select gates. Polygons 206-1, 206-2, 206-3, 206-4 and 206-5 correspond to the desired word lines. Thus, polygons 206-1 and 206-5 are for the adjacent word lines. Note that although only one polygon is shown per word line and select gate, nothing prevents another number of polygons from being used to provide a word line or select gate. Furthermore, although polygons 206-1 through 206-5 for only five word lines depicted, nothing prevents another number of polygons for another number of word lines and select gates from being provided. The polygons 202 and 210 are separated from polygons 206-1 and 206-5 by a first distance, s1. The polygons 206-1 through 206-5 are separated by a second distance, s2. The widths of the polygons 206-1 through 206-5 is the same because the corresponding word lines are desired to have a similar size. The widths of the polygons 202 and 210, however, differ.

The mask 200 also includes mask assist feature 204 and 208. Thus, there is one mask assist feature 204 and 208 for each adjacent word line and, therefore, each select gate. The mask assist features 204 and 208 have a width, w3, that is small enough to not be printed, yet large enough to affect the width of lines formed using the polygons 206-1 and 206-5.

Figure 5B:
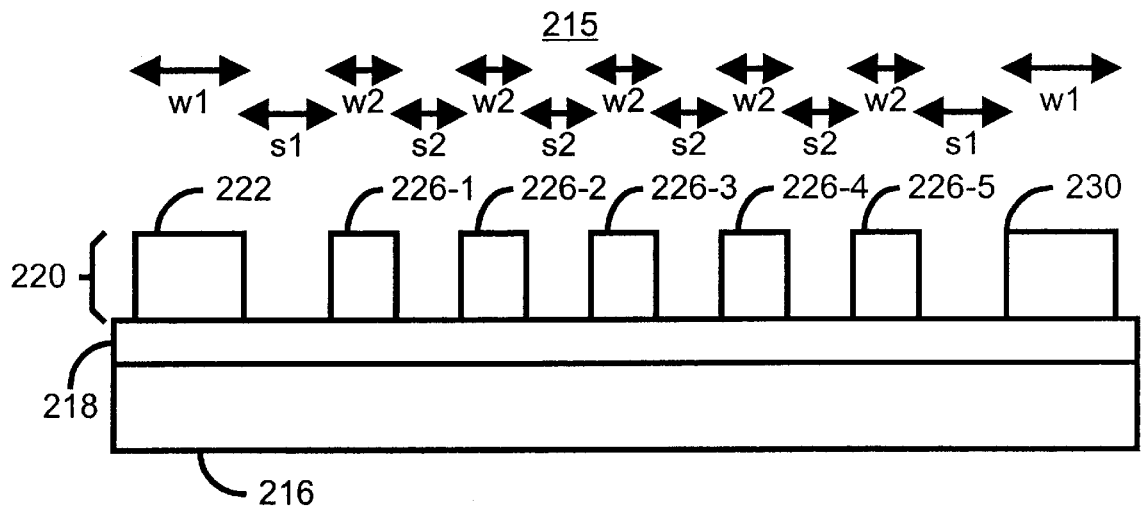
FIG. 5B is a diagram of a memory device in accordance with the present invention during fabrication, including physical mask formed in accordance with the present invention.

FIG. 5B depicts a memory device 215 in accordance with the present invention including a physical mask 220 printed from the mask 200 depicted in FIG. 5A. Referring to FIGS. 5A and 5B, the memory device 215 includes a substrate 216 and a second polysilicon layer 218, which is to be etched. The physical mask 220 includes portions 222 and 230 which correspond to the polygons 202 and 210, respectively. The portions 226-1 through 226-S of the physical mask 220 correspond to the word lines. Thus, portions 226-1 and 226-5 correspond to adjacent word lines. Because of the size of the mask assist features 204 and 208, there is no portion of the physical mask 220 which is printed for the mask assist features 204 and 208. However, the mask assist features 204 and 208 cause portions 226-1 and 226-5 to be printed thinner than they otherwise would have been. Thus, the widths of the portions 226-1 and 226-5 preferably match the widths of portions 226-2, 226-3 and 226-4.

Figure 5C:
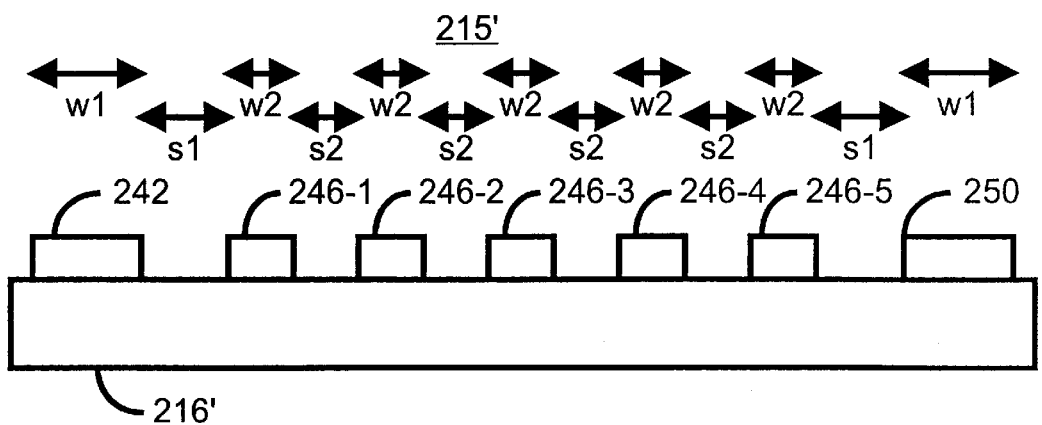
FIG. 5C is a diagram of a memory device in accordance with the present invention during fabrication, after the physical mask formed in accordance with the present invention has been stripped.

FIG. 5C depicts the memory device 215' after the physical mask 220 has been stripped. The memory device 215' still includes the substrate 216'. The second polysilicon layer 218 has been etched to form select gates 242 and 250 as well as word lines 246-1, 246-2, 246-3, 246-4 and 246-5. Because the portions 226-1 and 226-5 of the physical mask 220 depicted in FIG. 5B were printed thinner than for a conventional physical mask, the adjacent word lines 246-1 and 246-5 are also thinner than conventional adjacent word lines. Thus, the adjacent word lines 246-1 and 246-5 can have substantially the same width as the remaining word lines 246-2, 246-3 and 246-4. Thus, as can be seen in FIG. 5C, the lines 246-1 through 246-5 have a width, w2. This is true even though the spacing between word lines 246-1 through 246-5, s2, is different than the spacing, s1, between adjacent word lines 246-1 and 246-5 and the select gates 242 and 250, respectively. In a preferred embodiment, the spacing s1 is approximately 0.35 micron while the spacing s2 is approximately 0.25 micron. As a result, the adjacent word lines 246-1 and 246-5 can have substantially the same electrical characteristics as the word lines 246-2, 246-3 and 246-4. Consequently, the performance the word lines 246-1 through 246-5 is similar. Thus, the performance of the word lines 246-1 through 246-5 is more uniform, as desired.

A method and system has been disclosed for providing lines having a desired width and, therefore, more uniform performance. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a plurality of lines and an adjacent feature for a memory device, the plurality of lines and the adjacent feature being formed from a layer of material, the plurality of lines including an adjacent line adjacent to the adjacent feature, the adjacent line having a width, the method comprising the steps of:

(a) utilizing a mask to print a physical mask for the plurality of lines and the adjacent feature, the mask including a mask assist feature between at least a first polygon for the adjacent line and at least a second polygon for the adjacent feature, the mask assist feature having a size that is sufficiently large to affect the width of the adjacent line and that is sufficiently small to prevent a corresponding feature from being printed on the physical mask; and (b) removing a second portion of the layer of material exposed by the pattern of the physical mask to form the plurality of lines.

2. The method of claim 1 wherein the mask further includes a plurality of polygons for the plurality of lines and the adjacent feature, the plurality of polygons printing a pattern for the physical mask, the pattern of the physical mask covering a first portion of the layer of material, the plurality of polygons including the at least the first polygon and the at least the second polygon.

3. The method of claim 1 wherein the mask utilizing step (a) further includes the step of:

(a1) using light having a wavelength in order to print the physical mask from the mask; and
   wherein the size of the mask assist feature is less than the wavelength of the light.

4. The method of claim 3 wherein the size of the mask assist feature is between one-fifth and one-half of the wavelength of the light.

5. The method of claim 1 wherein the plurality of lines includes a plurality of word lines.

6. The method of claim 5 wherein the adjacent feature includes a select gate.

7. The method of claim 1 wherein each of the plurality of lines have a line width that is substantially the same as the width of the adjacent line.

* * * * *